United States Patent [19]

Spanjer

[11] Patent Number: 4,595,647
[45] Date of Patent: Jun. 17, 1986

[54] METHOD FOR ENCAPSULATING AND MARKING ELECTRONIC DEVICES

[75] Inventor: Keith G. Spanjer, Scottsdale, Ariz.

[73] Assignee: Motorola, Inc., Schaumburg, Ill.

[21] Appl. No.: 697,183

[22] Filed: Feb. 1, 1985

[51] Int. Cl.⁴ .................. B05D 3/06; B01J 13/02; H01L 21/265; B23K 26/00

[52] U.S. Cl. ...................... 430/138; 29/574; 29/576 T; 264/22; 264/132; 264/272.17; 427/53.1; 427/213.31; 427/213.36; 427/221; 430/945

[58] Field of Search ............ 427/53.1, 221, 213.31, 427/213.36; 264/132, 272.17, 22; 430/945; 29/574, 576 T

[56] References Cited

U.S. PATENT DOCUMENTS

| | | | |
|---|---|---|---|
| 3,869,563 | 3/1975 | Ocken, Jr. | 264/272.17 |
| 3,969,327 | 7/1976 | Stein et al. | 260/78.5 R |
| 4,042,550 | 8/1977 | Tuller et al. | 260/280 P |
| 4,219,721 | 8/1980 | Kamen et al. | 219/120 LM |
| 4,340,654 | 7/1982 | Campi | 430/945 |
| 4,444,829 | 4/1984 | Bollen et al. | 428/220 |
| 4,460,537 | 7/1984 | Heinle | 264/297.1 |
| 4,467,172 | 8/1984 | Ehrenwald et al. | 219/121 LM |
| 4,515,867 | 5/1985 | Bleacher et al. | 427/53.1 |
| 4,522,656 | 1/1985 | Kuhn-Kuhnenfled et al. | 29/576 T |

FOREIGN PATENT DOCUMENTS 0113167   7/1984   European Pat. Off. ........... 427/53.1

*Primary Examiner*—John E. Kittle
*Assistant Examiner*—Mukund J. Sham

[57] ABSTRACT

An improved laser markable material useful for encapsulation of electronic devices is obtained by adding $TiO_2$ or $TiO_2+CrO_3$ to common plastic encapsulants formed from a mixture of a resin+filler+carbon black+mold release agent. When irradiated by a laser, the originally grey material turns bright gold, providing a high contrast durable mark. The material has excellent marking contrast as well as better stability with time and temperature as compared to prior art laser markable encapsulants. Desirable concentrations, in weight percent of the compound, are 1–5% $TiO_2$ and 0–3% $CrO_3$, with 1–3% $TiO_2$ and 0.5–2% $CrO_3$ being preferred. Carbon black is optional but a concentration in the range 0.1–3% by weight is desirable with 0.5–1% preferred. Improved encapsulation and marking methods and improved devices using this material are described.

10 Claims, 3 Drawing Figures

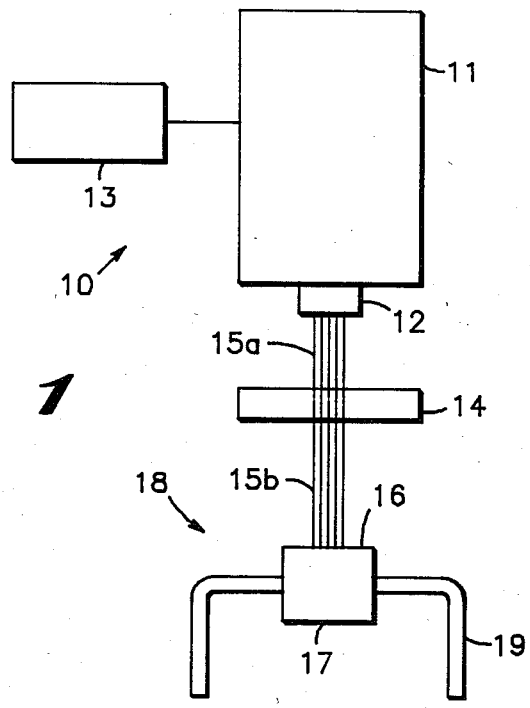
FIG. 1
FIG. 2
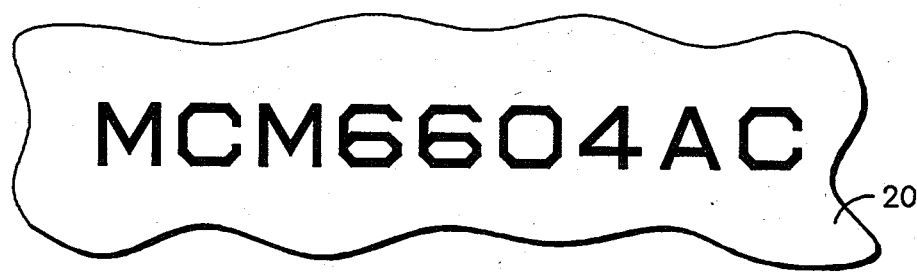
FIG. 3
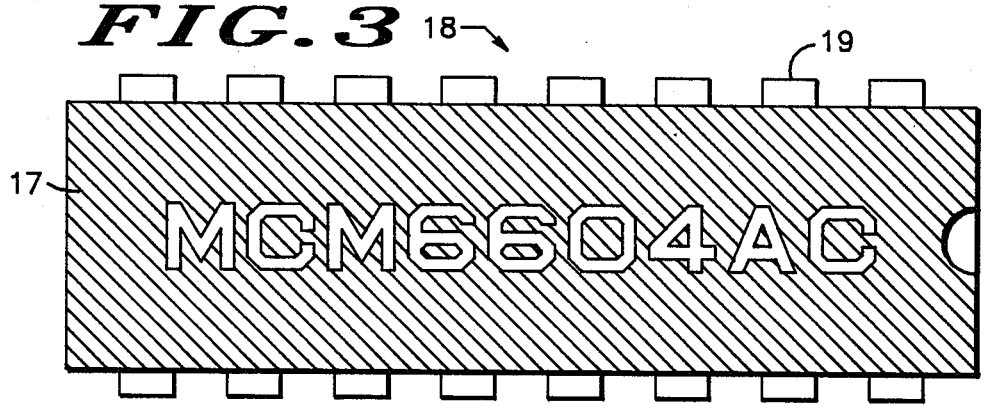

METHOD FOR ENCAPSULATING AND MARKING ELECTRONIC DEVICES

FIELD OF THE INVENTION

This invention relates in general to radiation markable materials and, more particularly, to improved markable plastic encapsulation for electronic devices, including improved materials adapted for laser marking of electronic devices, improved methods for laser marking electronic devices, and improved laser markable electronic devices.

BACKGROUND ART

It is commonplace in the electronic art to place alphanumeric codes upon electronic devices for identification purposes. Historically this has been accomplished by using printing with type and ink. Means for carrying out such printing to mark devices are well-known in the art.

Recently, laser marking has been used as a replacement for printing. With laser marking, a very intense beam of light is scanned over the device surface to write out the desired markings or is projected onto the device surface through a shadow mask containing an image of the desired markings. The intense light from the laser burns, melts, ablates, or otherwise alters the surface of the device to leave a visible imprint.

Prior art laser marking techniques suffer from a number of problems and limitations, for example, visibility of the markings is often poor because of the low contrast between the irradiated areas and the nonirradiated areas. In many cases, the markings are easily damaged. For example, if marking is accomplished by burning of the surface the char or other debris formed as a result of the laser irradiation can easily rub off during subsequent handling so that the markings are lost. Further, if the laser merely produces melting or ablation, the markings can become invisible if the device is covered with a clear coating or sealer during a further stage of assembly or use, as is often the case with electronic devices.

One method which has been used to overcome these problems is to use a surface coating of a different color than the base material. The laser locally vaporizes the coating so that the darker (or lighter) base material shows through. However, this method adds additional manufacturing cost since the surface coating must be added after normal encapsulation.

Another approach has been to place a dye in the encapsulation material so that the encapsulation material itself changes color when hit by the laser. An example of this is Hysol Blue Laser Enhanced Molding Compound manufactured by the Hysol Company, Olean, N.Y. Another example is plastic molding compound containing ferric oxide. The ferric oxide containing material changes from a generally gold color to a dark brown color when irradiated by a laser.

Prior art dye loaded materials often provide less than the desired degree of color contrast after irradiation and/or suffer from color degradation when exposed to elevated temperatures for an extended period of time. Since many electronic devices must withstand elevated temperatures for hundreds to thousands of hours during testing and use it is highly desirable to have materials which not only provide good marking visibility, but are also stable. A further consideration which is particularly important for electronic devices is that the coloring agents or dyes must not add alpha particle sources or mobile ion sources to the encapsulation material since these are known to cause severe degradation of electronic devices, particularly semiconductor devices.

Accordingly, it is an object of the present invention to provide an improved material adapted for laser marking of electronic devices.

It is a further objective to provide an improved material for laser marking of electronic devices which gives a high degree of color contrast when laser irradiated, as compared to the non-irradiated portion of the material.

It is an additional objective of the present invention to provide an improved material adapted for laser marking of electronic devices which shows less color change or contrast degradation with time and temperature as compared to prior art materials.

It is a further object of the present invention to provide this improved laser marking material without introducing mobile ions and/or alpha particle sources.

It is a still further object of the present invention to provide this improved laser marking material using raw materials which are inexpensively and readily obtained free of mobile ion and alpha particle contamination.

It is an additional object of the present invention to provide an improved method for forming electronic devices adapted for laser marking using the above-mentioned material.

It is a further object of the present invention to provide an improved method for laser marking electronic devices using the above-mentioned material.

It is an additional object of the present invention to provide improved electronic devices utilizing the above-mentioned laser markable material and method.

SUMMARY OF THE INVENTION

The attainment of the foregoing and other objects and advantages is achieved through the present invention wherein there is provided a laser markable compound comprising a plastic resin in which is mixed a filler material and a coloring material. The coloring material comprises titanium oxide and/or mixtures of titanium oxide and chromium oxide. Useful concentrations in weight percent of the markable compound are 1-5% titanium oxide and 0-3% chromium oxide. Preferred ranges are 1-3% titanium oxide and 0.5-2% chromium oxide. Carbon black in the range of 0.1-3% weight percent is also desirably added. The filler material desirably comprises silicon oxide or aluminum oxide or a mixture of silicon oxide and aluminum oxide, preferably having a concentration in the markable compound in the range 65-75% by weight. Useful resin materials comprise epoxy, silicone, or polyimide.

A method is provided for encapsulating or forming laser markable devices comprising providing an assembly containing the inner workings of the device, placing the assembly in a mold, and covering a portion of the assembly with the above-described laser markable compound. In a further embodiment, the above-described laser markable compound is coated on a device as a surface layer. In an additional embodiment of the process devices encapsulated with the above-described laser markable compound or having the above-described laser markable compound on a portion of their outer surface are irradiated with a laser to change the color of the irradiated portion of the surface of the device.

Improved devices adapted for laser marking are obtained by encapsulating or coating assemblies or finished devices with the above-described laser markable material. Thereafter they may be conveniently laser irradiated to produce high contrast durable markings.

BRIEF DESCRIPTION OF THE DRAWINGS

FIG. 1 is a simplified schematic drawing of a conventional laser marking system;

FIG. 2 is an enlarged portion of a typical shadow mask used in the laser marking system of FIG. 1; and FIG. 3 is a top view of an electronic device marked in the laser marking system of FIG. 1 using the shadow mask of FIG. 2.

DETAILED DESCRIPTION OF THE DRAWINGS

FIG. 1 shows a simplified schematic view of conventional laser marking system 10 comprising laser 11, lens system 12, and laser control system 13. The LASERMARK, manufactured by Lumonics, Inc., Tempe, Ariz. is a suitable commercially available system (LASERMARK is a registered trademark of Lumonics, Inc.). When laser 11 is energized, an intense beam of light 15a–b is projected from lens system 12 through shadow mask 14 onto surface 16 of body 17 of electronic device 18. Exemplary electronic device 18 of FIG. 1 has leads 19. When laser beam 15a–b impinges on surface 16, material of surface 16 is altered, e.g., by heating, vaporization, burning, melting, or combinations thereof. The result is generally a color or texture change or both, having the image of shadow mask 14.

FIG. 2 shows, greatly enlarged, central portion 20 of shadow mask 14 containing a typical marking pattern for an electronic device, in this example, the marking pattern for a type MCM6604AC integrated circuit. The resulting marking pattern is shown in top surface 16 of device 18 in FIG. 3, as it appears after irradiation by laser 11. This invention is applicable to any type of electronic device or other object, a portion of whose surface can be formed from or coated with the invented material. The particular device markings play no part in this invention.

Body 17 of electronic device 18 is commonly of plastic and is typically formed by encapsulating a standard lead frame (not shown) with a plastic compound by transfer molding, injection molding, or potting in a mold. Techniques for encapsulation of electronic lead frames or internal assemblies by transfer molding are well-known in the art and are described, for example, in U.S. Pat. No. 4,460,537 to Heinle, entitled "Slot Transfer Molding Apparatus and Method", which is incorporated herein by reference. Encapsulation by injection molding and potting is also well-known in the art.

Typical molding compounds for encapsulation of electronic components comprise a resin, a filler material, a mold release agent and one or more coloring agents. Epoxies, silicones, and polyimides are suitable resins. Filler materials commonly used in connection with electronic devices, particularly semiconductor devices, are silicon oxide, aluminum oxide, or mixtures thereof. Silicon oxide in the form of powdered vitreous silica, as for example quartz, is preferred as a filler material. Powdered alumina is a desirable form of aluminum oxide for a filler material. Generally materials of high purity are required in order to avoid undesirable contaminants, such as alpha particle emitting materials and/or materials containing mobile ions. Sodium is an example of a mobile ion known to be particularly deleterious to semiconductor devices. Rare-earth isotopes are known to act as alpha particle emitters and are often found to be naturally present in small concentrations in ores used to produce common filler materials. Quartz is a particularly desirable filler material in that it can be readily and comparatively inexpensively purified to remove contaminants which are sources of alpha particles and mobile ions. A few percent of carbon black is frequently also added to insure that the encapsulant material is opaque, since it is generally desirable that no light penetrate to the electronic devices inside the encapsulant. In addition, it is common to include a few percent of a release agent such as Carnuba wax to the molding compound to facilitate removal of the molded parts from the mold.

While laser irradiation will provide visible marks on devices encapsulated just with a quartz loaded resin (with or without carbon black), the markings tend to have low contrast and to be easily removed during subsequent handling. This is a consequence of the fact that the visibility of such markings results mostly from the change in texture of the irradiated surface and not a change in color. The change in texture is easily obscured by a transparent film.

The visibility of the laser markings can be enhanced by covering the surface of an encapsulated device with a coating of contrasting color. The laser locally vaporizes the surface coat allowing the contrasting body color to show through. This provides good contrast and generally durable markings. However, additional manufacturing cost is required to apply the surface coating. It is highly desirable to be able to use a markable compound which will give durable high contrast markings without any need for a supplementary surface coating.

When ferric oxide is added to a typical quartz loaded resin molding compound a gold colored encapsulant material is obtained which will turn brown when irradiated by a laser. Color contrast is fair to good. However, it has been found that the stability of the ferric oxide colored material is less than desired. For example, when heated at 200 degrees centigrade for 200–500 hours, the entire plastic body tends to darken toward a brown color, the same color as produced by the laser. This reduces the contrast of the markings. Hysol-Blue molding compound supplied by Hysol, Inc., Olean, N.Y. gives encapsulated devices with a hazy blue color. When laser irradiated the material turns black. While the laser markings are visible, the contrast is less than desired, especially when covered with a transparent coating.

It has been found that a laser markable material or compound of superior color contrast and stability can be obtained by adding titanium oxide or a mixture of titanium oxide and chromium oxide to filler loaded resins, with or without carbon black. Powdered silica is a preferred form of filler. Quartz is the preferred form of silica. Alumina loaded resins are also believed to be suitable, as well as compounds with mixtures of silica and alumina fillers. The titanium oxide is preferably $TiO_2$ in the form of a high purity fine powder. The $TiO_2$ particles should be less than 10 microns in size, preferably less than 5 microns. The chromium oxide is preferably $CrO_3$ also in the form of a fine powder of similar particle size. The $TiO_2$ and $CrO_3$ constituents are usefully in the range 1–5% $TiO_2$ and 0–3% $CrO_3$ by weight percent of the compound, with 1–3% $TiO_2$ and 0.5–2% $CrO_3$ being preferred. Good results were obtained using 2% $TiO_2$ plus 1% $CrO_3$ by weight. A fine quartz filler making up 65–75% by weight of the markable compound is suitable. Carbon black, by weight percent of the markable compound, in the range 0.1-3% gave good results with 0.5-1% being preferred. While acceptable laser marking color contrast is obtained without the carbon black, using the carbon black gives improved color contrast and stabilizes the mixture so that the encapsulation or coating has generally a more uniform color. Markable materials made using $CrO_3$ alone in the range 3-5% by weight did not give as good color contrast and color stability as when combined with the $TiO_2$ in the proportions described above. Compounds of resin+filler+carbon black+mold release+$ZrO_3$ color additive were also tested and showed laser enhanced marking but gave poorer contrast and color stability than the compounds containing $TiO_2$.

A mold release agent (e.g. Carnuba wax) in the range 1-2% by weight was included in the molding compounds tested. The release agent is believed to act cooperatively with the $TiO_2$ and/or the $TiO_2+CrO_3$ to enhance the color contrast on laser marking by bringing a higher concentration of these color additives to the surface during heating. The release agent is generally more volatile than the other materials in the molding compound and thus has a tendency when heated to migrate preferentially to the surface, e.g. during molding. As the mold release migrates to the surface, it is believed to transport $TiO_2$ or $CrO_3$ or both to the surface so that the surface concentration of $TiO_2$ or $CrO_3$ or both are enriched as compared to the bulk. Having a higher surface concentration as compared to the bulk is believed to give a higher contrast than might otherwise be obtained. Accordingly, inclusion of 1-2% by weight release agent in the markable molding compound is desirable.

A typical prior art molding compound formed from a mixture of epoxy resin +65-67% quartz +2-4% carbon black +1-2% Carnuba wax mold release has a grey color. When irradiated by a laser marker, the irradiated areas become a darker grey. Adding a 1-5% $TiO_2$ to this mix does not appreciably change the hue of the as-formed material, producing only a slight lightening of the grey. However, when the $TiO_2$ containing material is irradiated by a laser the irradiated portions become golden colored, giving a highly visible high contrast mark.

Adding 3% or less of $CrO_3$ to the $TiO_2$ containing mixture also does not change the color of the nonirradiated material appreciably imparting at most a slightly greener hue to the otherwise grey mixture. When the $TiO_2+CrO_3$ containing material is irradiated by a laser the irradiated areas also turn gold. The laser marks on the $TiO_2+CrO_3$ containing material have a higher contrast compared to the greenish-grey background body than when the $TiO_2$ is used alone. It was found to be desirable to reduce the carbon black concentration (in weight percent) in these mixtures to the 0.1-3% range, preferably to the 0.5-2% range. The carbon black may be omitted entirely but the overall color uniformity and stability are not as good as when some carbon black is present.

The color stability of the above-described laser markable materials was tested by subjecting encapsulated devices, with and without laser markings, to varying time periods at temperatures ranging from 85 degrees centigrade at 85% relative humidity to 200 degrees centigrade at ambient humidity. The higher the temperature the more severe the test so far as color and marking stability is concerned. Time-temperature tests are routinely performed on electronic components to insure their stability and survival in use and methods for such tests are well-known in the art.

The devices encapsulated or coated with a material made from a mixture of resin+quartz filler+carbon black+mold release+$(TiO_2)$ or $(TiO_2+CrO_3)$ in the proportions described above, showed less color degredation and laser mark contrast degredation after 1000 hours at 200 degrees centigrade than any of the prior art materials, such as the ferric oxide loaded material, the Hysol-Blue material, or the resin+filler carbon black+mold release material without the $TiO_2$ and/or $CrO_3$.

The above-described material containing $TiO_2$ or $TiO_2+CrO_3$ may be advantageously used to encapsulate electronic devices. The un-encapsulated electronic assembly is placed in a mold and the desired portions covered with a laser markable molding compound formed from a mixture of resin+filler+carbon black+mold release+$(TiO_2)$ or $(TiO_2+CrO_3)$ in the proportions described previously. The carbon black and the mold release are optional, but superior encapsulation properties and/or molding convenience are obtained when they are used in the proportions described above. Molding may be conveniently done in a transfer mold, such as described by Heinle in U.S. Pat. No. 4,460,537, or by injection molding or by potting. These techniques are well-known in the art.

A virtue of the invented laser markable material is that the added coloring agents in the concentrations used do not significantly interfere with the molding properties of the material. A resin+filler+$(TiO_2)$ or $(TiO_2+CrO_3)$ containing material may also be used as a surface coating on electronic devices which have been encapsulated with other materials in order to have a portion of the device which is particularly adaptable to marking. For example, metal, glass, ceramic, or plastic encapsulated devices may be coated with a layer or provided with a region comprising a resin+filler+-$(TiO_2)$ or $(TiO_2+CrO_3)$ mixture for laser marking purposes.

The electronic devices formed using the materials and methods of the present invention have superior properties, in particular, when portions of the device having an encapsulation or coating made from a material containing the above-described amounts of $TiO_2$ and/or $TiO_2+CrO_3$ are irradiated with a laser, high contrast durable stable markings are obtained. Further, addition of $TiO_2$ or $TiO_2+CrO_3$ does not introduce any alpha particle emitting species or mobile ion species into the encapsulation or coating which would be detrimental to the stability of the underlying electronic assembly.

Having thus described the invention, it is apparent that the present invention provides an improved laser markable material for electronic devices, an improved method for encapsulation and/or marking of laser markable electronic devices, and electronic devices of improved properties by virtue of their ability to be readily marked by laser, and the clarity and durability of the marks thus obtained. While the invention has been illustrated in particular terms, those of skill in the art will recognize that the invention is applicable to all types of semiconductor devices, bubble memories, passive components, electro-optical devices, and all other manner of electronic assemblies and other products. Accordingly, it is intended to include all such variations in the claims that follow.

What is claimed is:

1. A method for encapsulating laser markable devices comprising:
   providing an internal assembly;
   placing said internal assembly in a mold;
   providing a molding compound comprising a plastic resin containing a powdered filler material and a coloring material, wherein said filler material comprises silicon oxide or aluminum oxide or a mixture of silicon oxide and aluminum oxide, and wherein said coloring material includes titanium dioxide powder in the range 1–5% by weight and carbon black powder in the range 0–3% by weight; and
   encapsulating a portion of said internal assembly with said molding compound.

2. The method of claim 1 wherein said coloring material includes titanium dioxide powder in the range 1–3% by weight, chromium oxide powder in the range 0–3% by weight, and carbon black powder in the range 0.5–1% by weight.

3. A method for making plastic encapsulated devices comprising:
   providing a device having a portion formed from a compound comprising a plastic resin, an alumina, silica, or silica-alumina filler powder, and a coloring material, wherein said coloring material comprises titanium dioxide powder in the range 1–5% and carbon black powder in the range 0–3% by weight of the compound; and
   irradiating part of said portion of said device with an intense radiation source to produce a color change in said compound.

4. The method of claim 3 wherein said coloring material further comprises 0–3% by weight of chromium oxide.

5. A method for marking plastic encapsulated devices comprising:
   providing a device encapsulated with a compound comprising a plastic resin, a filler material of silica, alumina, or silica-alumina powder, and a coloring material, wherein said coloring material comprises titanium dioxide powder in the range 1–5% and carbon black powder in the range 0–3% by weight of the compound; and
   irradiating part of said device with radiation to locally heat a portion of said compound to produce a color change in said compound.

6. The method of claim 5 wherein said coloring material further comprises 0–3% by weight of chromium oxide.

7. The method of claim 1 wherein said titanium oxide is in the range 1–3% by weight and said chromium oxide is in the range 0.5–2% by weight.

8. The method of claim 1 wherein said compound comprises 65–75% by weight of said filler material.

9. The method of claim 3 wherein said compound comprises 65–75% by weight of said filler material.

10. The method of claim 5 wherein said compound comprises 65–75% by weight of said filler material.

* * * * *